United States Patent
Swinkels et al.

(10) Patent No.: US 8,507,882 B2
(45) Date of Patent: Aug. 13, 2013

(54) RADIATION SOURCE AND LITHOGRAPHIC APPARATUS

(75) Inventors: Gerardus Hubertus Petrus Maria Swinkels, Eindhoven (NL); Vadim Yevgenyevich Banine, Helmond (NL); Erik Roelof Loopstra, Eindhoven (NL); Johannes Hubertus Josephina Moors, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 222 days.

(21) Appl. No.: 12/543,578

(22) Filed: Aug. 19, 2009

(65) Prior Publication Data

US 2010/0053581 A1  Mar. 4, 2010

Related U.S. Application Data

(60) Provisional application No. 61/136,305, filed on Aug. 26, 2008, provisional application No. 61/193,201, filed on Nov. 5, 2008.

(51) Int. Cl.
  *G03B 27/42* (2006.01)
  *H01J 19/12* (2006.01)

(52) U.S. Cl.
  USPC ............................................. 250/504 R

(58) Field of Classification Search
  USPC ..................... 355/53; 250/493.1–504 R
  See application file for complete search history.

(56) References Cited

U.S. PATENT DOCUMENTS

| | | | |
|---|---|---|---|
| 6,647,088 B1 * | 11/2003 | Schmidt et al. | 378/34 |
| 6,738,452 B2 * | 5/2004 | McGregor et al. | 378/119 |
| 7,193,229 B2 | 3/2007 | Banine et al. | 250/504 R |
| 7,476,886 B2 * | 1/2009 | Bykanov et al. | 250/504 R |
| 7,576,343 B2 | 8/2009 | Tomie | |
| 7,880,860 B2 * | 2/2011 | Jansen et al. | 355/30 |
| 2006/0132731 A1 * | 6/2006 | Jansen et al. | 355/30 |
| 2006/0249699 A1 * | 11/2006 | Bowering et al. | 250/504 R |
| 2006/0255298 A1 * | 11/2006 | Bykanov et al. | 250/504 R |
| 2008/0067456 A1 * | 3/2008 | Kloepfel et al. | 250/504 R |

FOREIGN PATENT DOCUMENTS

| | | |
|---|---|---|
| JP | 2004-288517 | 10/2004 |
| JP | 2006-156577 | 6/2006 |
| JP | 2006-210157 | 8/2006 |
| JP | 2010-003548 | 1/2010 |

OTHER PUBLICATIONS

Japanese Office Action for Japanese Patent Application No. 2009-189611, mailed on Aug. 10, 2011.

* cited by examiner

*Primary Examiner* — David A Vanore
*Assistant Examiner* — Wyatt Stoffa
(74) *Attorney, Agent, or Firm* — Pillsbury Winthrop Shaw Pittman LLP

(57) ABSTRACT

A radiation source is configured to generate extreme ultraviolet radiation. The radiation source includes a droplet generator constructed and arranged to generate fuel droplets, a heater constructed and arranged to heat the fuel droplets following generation of the fuel droplets by the droplet generator, and reduce the mass of fuel present in the fuel droplets and/or reduce the density of the fuel droplets, and a radiation emitter constructed and arranged to direct radiation onto the fuel droplets that have been heated by the heater to generate the extreme ultraviolet radiation.

11 Claims, 4 Drawing Sheets

RADIATION SOURCE AND LITHOGRAPHIC APPARATUS

CROSS-REFERENCE TO RELATED APPLICATIONS

This application claims the benefit of priority from U.S. Provisional Application Ser. Nos. 61/136,305, filed on Aug. 26, 2008, and 61/193,201, filed on Nov. 5, 2008, the contents of both of which are incorporated herein by reference in their entireties.

FIELD

The present invention relates to an extreme ultraviolet (EUV) radiation source, and a lithographic apparatus that includes such a source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to be able to project ever smaller structures onto substrates, it has been proposed to use EUV radiation, which is electromagnetic radiation having a wavelength within the range of 10-20 nm, for example within the range of 13-14=nm. It has further been proposed that EUV radiation with a wavelength of less than 10 nm could be used, for example within the range of 5-10 nm such as 6.7 nm or 6.8 nm.

Radiation may be produced using plasma. The plasma may be created, for example, by directing a laser at a fuel, such as particles of a suitable material (e.g. tin), or a stream of a suitable gas or vapor, such as Xe gas or Li vapor. The resulting plasma emits radiation, e.g., EUV radiation, which is collected using a collector such as a mirrored collector, that receives the radiation and focuses the radiation into a beam. The radiation emitting plasma and the collector may together be considered to comprise a radiation source. A radiation source which generates plasma by directing a laser onto fuel particles, as described above, is often referred to as a laser produced plasma (LPP) source.

In addition to radiation, the generation of plasma by a plasma radiation source produces contamination in the form of particles, such as thermalized atoms, ions, nanoclusters, and/or microparticles. The contamination is output, together with the desired radiation, from the plasma towards the collector and may cause damage to the collector and/or other parts of the radiation source, and/or other parts of the lithographic apparatus.

It is desirable to reduce the incidence of contamination on surfaces of a radiation source and/or other parts of a lithographic apparatus.

SUMMARY

According to an aspect of the invention, there is provided a radiation source configured to generate extreme ultraviolet radiation. The radiation source includes a droplet generator constructed and arranged to generate fuel droplets, a heater constructed and arranged to heat the fuel droplets following generation of the fuel droplets by the droplet generator, and reduce the mass of fuel present in the fuel droplets and/or reduce the density of the fuel droplets, and a radiation emitter constructed and arranged to direct radiation onto the fuel droplets that have been heated by the heater to generate the extreme ultraviolet radiation.

According to an aspect of the invention, there is provided a lithographic apparatus that includes a radiation source configured to generate extreme ultraviolet radiation. The radiation source includes a droplet generator constructed and arranged to generate fuel droplets, a heater constructed and arranged to heat the fuel droplets following generation of the fuel droplets by the droplet generator, and reduce the mass of fuel present in the fuel droplets and/or reduce the density of the fuel droplets, and a radiation emitter constructed and arranged to direct radiation onto the fuel droplets that have been heated by the heater to generate the extreme ultraviolet radiation. The lithographic apparatus also includes a support constructed and arranged to support a patterning device configured to pattern a radiation beam comprising the extreme ultraviolet radiation, and a projection system constructed and arranged to project the patterned radiation onto a substrate.

According to an aspect of the invention, there is provided a method of generating extreme ultraviolet radiation. The method includes generating droplets of fuel, heating the fuel droplets to reduce the mass of fuel present in the fuel droplets and/or reduce the density of the fuel droplets, and subsequently directing radiation onto the fuel droplets to generate the extreme ultraviolet radiation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
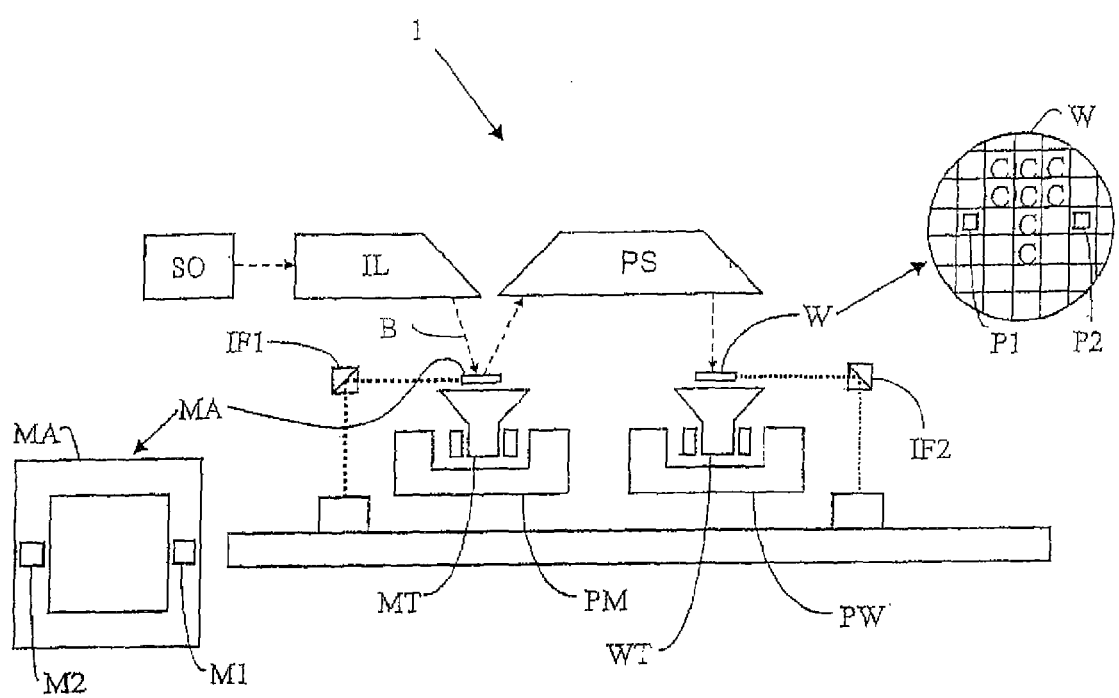
FIG. 1 schematically depicts a lithographic apparatus according to an embodiment of the invention.

FIG. 1 schematically depicts a lithographic apparatus 1 according to an embodiment of the invention. The apparatus comprises: an illumination system (illuminator) IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used. Any use of the term "projection lens" herein may be considered as synonymous with the more general term "projection system".

As here depicted, the apparatus may be of a reflective type (e.g. employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
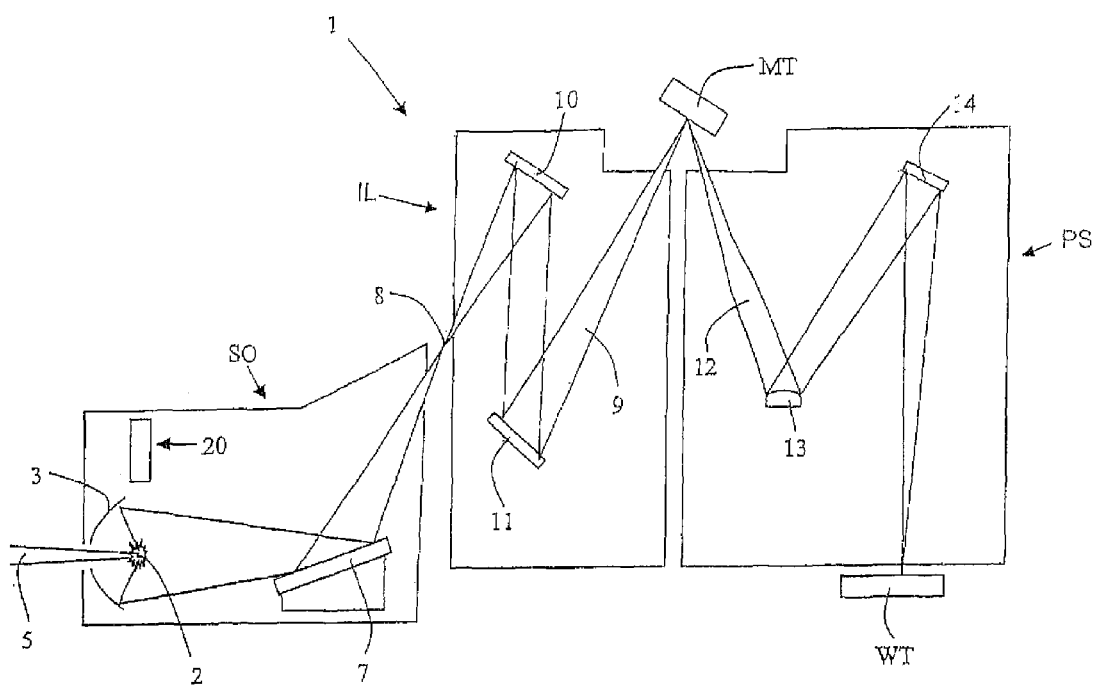
FIG. 2 schematically depicts in more detail the lithographic apparatus of FIG. 1 according to an embodiment of the invention.

FIG. 2 shows the apparatus of FIG. 1 in more detail, including the source SO, the illuminator IL, and the projection system PS. The source SO generates EUV radiation from a plasma 2. The plasma 2 is created by directing a laser beam 5 onto droplets of a suitable material such as Sn or Gd which are generated by a droplet generator 20. The laser beam 5 causes the droplets to be vaporized, thereby generating the plasma 2.

Radiation emitted by the plasma 2 is collected by a collector 3, and is directed onto a grating spectral filter 7. The radiation then passes from the grating spectral filter 7 to an intermediate focus 8. The intermediate focus 8 acts as a virtual source point 8 at an aperture in the source SO. From source SO, a beam of radiation 9 is reflected in the illuminator IL via first and second normal incidence reflectors 10, 11 onto a patterning device (e.g. a mask) positioned on support structure MT. A patterned beam 12 is formed which is imaged in the projection system PS via first and second reflective elements 13, 14 onto a substrate (not shown) held on a substrate table WT. More elements than shown may generally be present in the illuminator IL and projection system PS.

Figure 3:
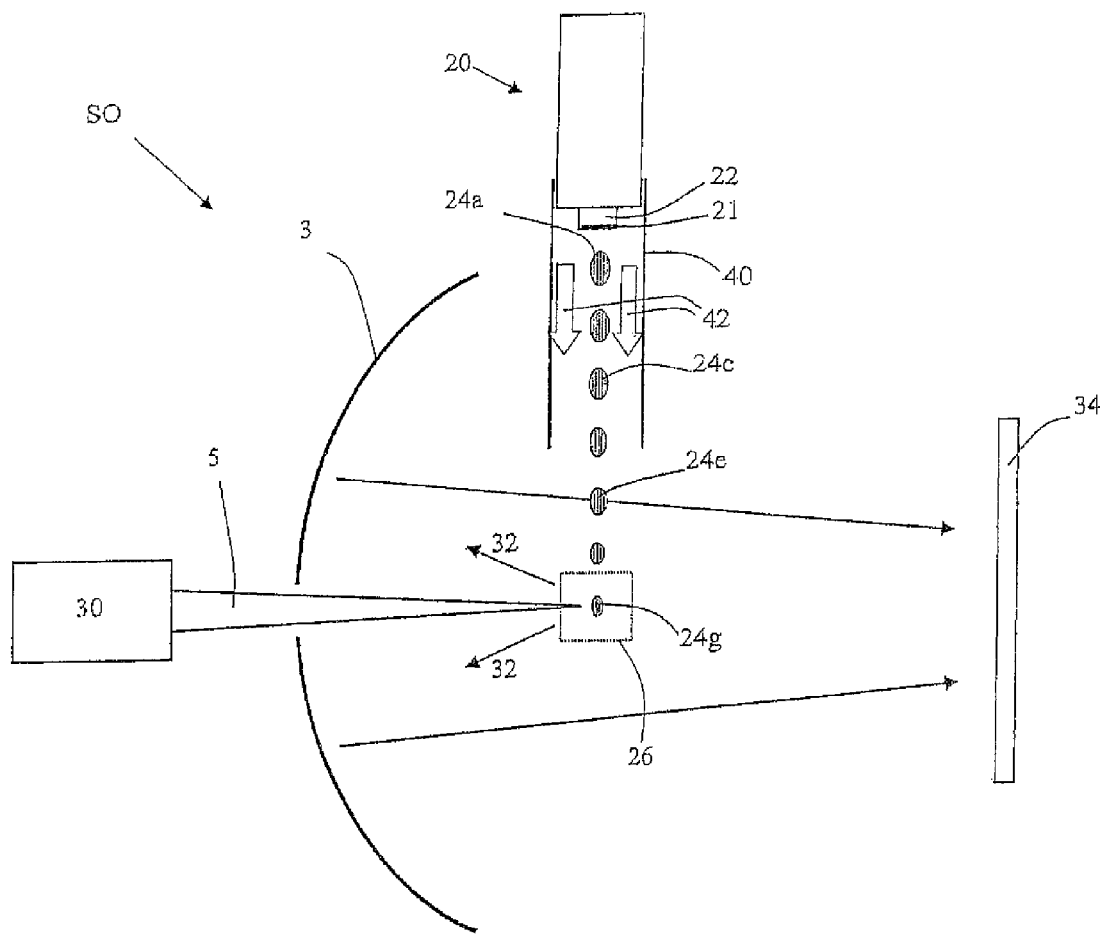
FIG. 3 schematically depicts a radiation source according to an embodiment of the invention.

FIG. 3 schematically depicts a radiation source according to an embodiment of the invention. This, and other embodiments of the invention, may be provided in the lithographic apparatus described above. The radiation source SO comprises a droplet generator 20 that is constructed and arranged to turn a liquefied fuel (target material), for example Sn or Gd into fuel droplets. The droplet generator 20 may include an opening (not shown) provided in a plate 21, the plate being attached to a piezo-electric actuator 22. The piezo-electric actuator 22 may be arranged to move the plate 21 with a pulsed motion, such that fuel droplets pass out of the opening. This droplet generation mechanism may be similar to the droplet generation mechanism used by inkjet printers.

The droplet generator 20 delivers a regularly spaced series of fuel droplets 24a-g to an interaction region 26. Although the droplet generator 20 is shown in FIG. 3 as being above the interaction region 26, it may for example be to the side of the interaction region 26. The fuel droplets do not merely fall from the droplet generator 20 under the influence of gravity, but instead are projected from the droplet generator, and for example may travel at a speed in the range of 20 to 60 m/s.

When a fuel droplet 24a-g reaches the interaction region 26, it is impinged upon by a radiation beam 5 that is provided by a radiation emitter 30, such as a laser. The laser 30 may for example be a $CO_2$ laser providing radiation at a wavelength of 10.6 micrometers. Alternatively, other suitable radiation emitters or lasers may be used having wavelengths in the range of 1-11 micrometers. The radiation beam 5 may be focused in the interaction region 26 using a suitable optical system (not shown). Upon interaction with the radiation beam 5 the fuel droplets 24a-g are transferred into plasma state which may emit 6.7 nm radiation, 13.5 nm radiation, or any other EUV radiation (for example in the range of 5-20 nanometres). In addition to emitting EUV radiation, the plasma may also emit radiation over a broad range of wavelengths, which may include wavelengths that fall outside of the EUV spectrum. The EUV radiation 32 may be collected by a collector 3 (which may be elliptically shaped), and directed as an EUV radiation beam towards an intermediate focus 8 (shown in FIG. 2).

The plasma generation produces contamination in the form of particles, such as thermalized atoms, ions, nanoclusters, and/or microparticles. This contamination may cause damage to the collector 3 and/or other parts of the lithographic apparatus. For this reason, the radiation source SO may include a buffer gas. The debris particles which collide with buffer gas molecules transfer their energy to those molecules, thereby reducing the distance over which the debris particles travel. If the density of the buffer gas is sufficiently high (such that a sufficient number of collisions with buffer gas molecules take place), the debris particles may lose their energy before they reach the collector 3 and/or other parts of the lithographic apparatus. In addition to the buffer gas, a contamination trap 34 may be provided in the radiation source, the contamination trap being configured to collect or to deflect debris particle emanating from the interaction region 26.

Typically, the buffer gas is not 100% effective in preventing debris particles from reaching the collector 3. Thus, debris particles will be incident on the collector 3, and over time the reflectivity of the collector will be reduced. This in turn reduces the intensity of EUV radiation which is available for direction onto the substrate W, and may thus reduce the throughput of the lithographic apparatus. It is desirable therefore to reduce the incidence of debris particles on the collector 3.

The droplet generator 20 is typically configured to generate fuel droplets of 50 μm diameter or larger. The diameter of the fuel droplets is determined by the diameter of the opening in the plate 21 of the droplet generator. Although it may be possible to provide an opening which is less than 50 μm in diameter, this is generally not done because such a narrow opening will have a substantially increased likelihood of becoming blocked by debris. A blockage would cause the generation of fuel droplets to stop, thereby interrupting operation of the lithographic apparatus. Thus, in some systems it may be desirable to generate fuel droplets using an opening which has a diameter of 50 μm or more.

Not all of the material in the fuel droplet will contribute to EUV radiation generation. The material which does not contribute to EUV radiation generation will be converted into debris particles. Taking the example of Sn, when the radiation beam 5 is incident upon a 50 μm Sn droplet, a significant proportion of the Sn will not form EUV generating plasma, but will instead form Sn particles. This occurs because there is a limit to the mass of Sn which can be vaporized by the radiation beam, and Sn which is in excess of this mass forms Sn particles instead. These Sn particles are typically 50-100 nm across, have a relatively high mass (compared with other debris particles) and have high energy. It is therefore difficult to prevent them from being incident upon the collector 3.

The embodiment of the invention may reduce the amount of fuel in the fuel droplets. This allows a greater proportion of the fuel droplets to contribute to the EUV radiation generating plasmas and reduces the amount of debris particles which are generated. This in turn reduces contamination of the collector 3 (and other parts of the lithographic apparatus).

A thermal heater 40 is used to reduce the amount of fuel in the fuel droplets 24 after the fuel droplets are produced. The thermal heater 40 comprises one or more heater elements which are arranged to radiate heat onto the droplets. The illustrated thermal heater 40 is cylindrical, and surrounds part of a path along which the droplets travel from the droplet generator 20 to the interaction region 26, such that the droplets are heated as they travel towards the interaction region 26. A typical length of the thermal heater may for example be 10 cm, in a source SO in which the separation between the droplet generator 20 and the interaction region 26 is around 15 cm. However, the thermal heater may for example be up to 20 cm long, up to 15 cm long, up to 10 cm long, up to 5 cm long or any other suitable length. In general, the length of the thermal heater may be selected such that, taking into account the speed of travel of the fuel droplets, the fuel droplets are heated sufficiently to lose a significant portion of their fuel prior to entering the interaction region 26.

The thermal heater 40 may for example be formed from a cylinder of metal which is heated to an appropriate temperature, heat radiating inwardly from the cylinder and thereby heating the droplets 24a-g. Insulation (not shown) may be provided on an outer surface of the thermal heater, to reduce the amount of heat which is radiated outwardly to other parts of the source SO. Although the thermal heater is described as a cylinder, the thermal heater may take any suitable form (for example a pair of plates facing one another, or a tube which is square, rectangular or some other shape in cross-section).

FIG. 3, shows each fuel droplet 24a-g as being smaller in size than a preceding fuel droplet (i.e. shows the size of the fuel droplets decreasing as they travel towards the interaction region 26). This may be due to evaporation of fuel (Sn in this example) from the fuel droplets. Evaporation occurs due to molecules of fuel on the outer surface of the fuel droplet receiving sufficient energy via heat to allow them to escape from the surface of the fuel droplet. Evaporation of fuel from a fuel droplet may continue to occur after that fuel droplet has exited the thermal heater (due to heat which has already been transferred to the fuel droplet). FIG. 3 represents this by showing the fuel droplets 24e-g continuing to reduce in size after they have exited the heater thermal.

By causing fuel to evaporate from the fuel droplets, the thermal heater reduces the amount of fuel present in the droplets when they reach the interaction region 26. As mentioned above, there is a limit to the mass of fuel (e.g. Sn) which can be vaporized by the radiation beam 5, and fuel which is in excess of this mass may form unwanted debris particles instead. By reducing the amount of fuel which is present in the droplets, the number of debris particles generated may be reduced. The mass of fuel which is present in the droplets may be reduced for example such that the mass of fuel is less than or equal to the mass which can be vaporized by the radiation beam. Alternatively, the mass of fuel may be reduced, for example, such that the mass of fuel is closer to (although still greater than) the mass which can be vaporized by the radiation beam.

A gas flow may be provided within the thermal heater 40 (represented by arrows 42). The gas flow carries evaporated fuel to one or more exit ports (not shown) in the source, thereby removing the evaporated fuel from the apparatus. The gas which provides the gas flow may be introduced through ports (not shown) provided in walls of the thermal heater 40. The gas flow may be considered to be an example of a mitigation system. A gas flow, or other mitigation system, may be provided with any embodiment of the invention.

Although FIG. 3 shows the fuel droplets 24a-g as reducing in diameter as they travel from the droplet generator 20 to the interaction region 26, this may not always occur. In the absence of evaporation of fuel from the fuel droplets, heating of the fuel droplets would cause them to expand. Since both evaporation and expansion will take place, the diameter of a fuel droplet will increase if the effect of the expansion is greater than the effect of the evaporation, and will decrease if the effect of the evaporation is greater than the effect of the expansion.

Even if the diameter of the fuel droplet were to increase, an embodiment of the invention may still provide a reduction of the amount of debris particles generated during EUV radiation generation. This is because the amount of fuel in the fuel droplet is reduced.

Heating the fuel droplets causes their density to reduce. Reducing the density of the fuel droplets may help to improve penetration of the radiation beam 5 into the fuel droplets, thereby increasing the proportion of the fuel droplets which is converted to EUV generating plasma.

In an embodiment, after fuel droplet generation, the diameter of each fuel droplet may be for example between about 50 µm and about 100 µm. By evaporation, the fuel droplet diameter may be reduced to for example about 10 µm to about 25 µm. With expansion, the fuel droplet may become larger, but less dense. The amount of fuel present in the fuel droplet may decrease for example by more than 5%, more than 10%, more than 20%, more than 40%, more than 60%, or more than 80%.

Figure 4:
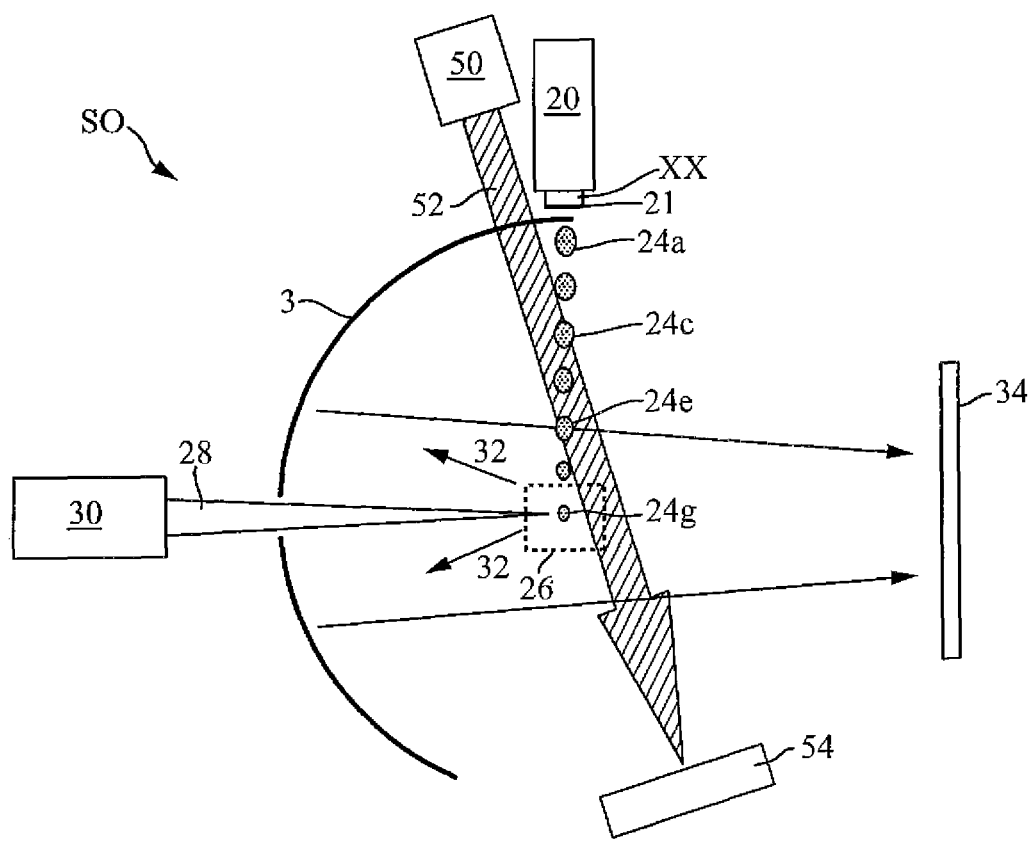
FIG. 4 schematically depicts a radiation source according to an embodiment of the invention.

In an embodiment, shown in FIG. 4, the heater is a laser 50 that is constructed and arranged to provide optical energy to the fuel droplets 24a-g. The laser 50 is configured to direct a laser beam 52 through part of the path traveled by the fuel droplets 24a-g between the droplet generator 20 and the interaction region 26. The laser beam heats the fuel droplets 24a-g, thereby providing the advantageous effects that were described above in relation to FIG. 3. A beam dump 54 may receive the laser beam 52, the beam dump being arranged to absorb the laser beam and thereby avoid or reduce scattering of the laser beam to other parts of the apparatus. Although the laser 50 is shown in FIG. 4 as being adjacent to the fuel droplet generator 20, it may be located elsewhere, with mirrors, optical fibre, or other apparatus being used to bring the laser beam 52 to an appropriate location.

The amount of heat which is imparted to the fuel droplets will depend in part on the path length over which the fuel droplets interact with the laser beam 52. The laser beam may therefore be provided at an acute angle with respect to the direction of travel of the fuel droplets. The angle may for example be less than 20 degrees, less than 10 degrees or less than 5 degrees. The laser beam may be collimated, in order to provide a constant beam diameter (or substantially constant beam diameter) at the locations where the fuel droplets interact with the laser beam. The laser 50 may for example provide a laser beam at an infrared wavelength. For example, the laser may provide a laser beam at a wavelength of 2 µm or greater, 5 µm or greater, for example 10.6 µM or 9.4 µm. The laser 50 may for example be a $CO_2$ laser.

The laser 50 may operate in continuous or pulsed mode. If the laser is operated in pulsed mode, then some synchronization of the pulses with droplet generation may be required.

A lamp may be used instead of the laser. The electromagnetic radiation generated by the lamp may for example be infrared radiation. The wavelength of electromagnetic radiation generated by the lamp may for example be 2 µm or greater, 5 µm or greater.

The lamp and laser may be considered to be examples of electromagnetic radiation generators. However, any suitable electromagnetic radiation generator may be used. The power of the electromagnetic generator may be controlled in order to achieve a desired reduction of the mass of fuel in the fuel droplets and/or achieve a desired reduction of the density of the fuel droplets.

Electromagnetic radiation reflectors (e.g. mirrors) may be used so that once the electromagnetic radiation beam crosses the path of the fuel droplets, the electromagnetic radiation beam is reflected back across the path of the fuel droplets. This may increase the path length over which the fuel droplets interact with the electromagnetic radiation.

Although FIGS. 3 and 4 respectively show heating of the fuel droplets using the thermal heater and heating of the fuel droplets using the electromagnetic radiation beam as two separate embodiments, they may be combined together such that the fuel droplets are heated by the heater and the electromagnetic radiation beam.

In an embodiment, the heater is an electron gun (e-gun) that is constructed and arranged to direct electrons onto the fuel droplets so as to heat the fuel droplets. In an embodiment, the heater is constructed and arranged to generate radio frequencies or microwave frequencies that are directed to the fuel droplets thereby heating them. For example the radio frequencies or microwave frequencies may be in the frequency range 1 MHz to 3 GHz.

Any other suitable fuel droplet heater that is configured to at least partially evaporate fuel from fuel droplets may be used. Any other suitable fuel droplet heater that is configured to reduce the density of fuel in droplets may be used. Embodiments of the invention are not limited to the fuel droplet heaters described herein.

The partial evaporation of the liquid droplets provided by the heater may be combined with mitigation of the vapor that is released during evaporation. For example, the gas flow described above in relation to FIG. 3 may be used in connection with any of the embodiments of the invention.

Mitigation of fuel vapor that is released during evaporation may use a Peclet type suppression of vapor. The Peclet effect describes the rate of advection of a flow to its rate of diffusion, often thermal diffusion. It is equivalent to the product of the Reynolds number and the Prandtl number in the case of thermal diffusion, and the product of the Reynolds number and the Schmidt number in the case of mass dispersion. As is known in the art, advection is a transport mechanism of a substance or a conserved property with a moving fluid. In an embodiment, a gas supply system that is adapted to supply a gas flow may use the Peclet effect to effectively prevent vapor, generated by the reduction of the droplets, from depositing on the collector mirror. In an embodiment, the gas flow contains hydrogen.

Embodiments of the invention may provide less production of debris particles such as fuel particles (e.g. Sn particles). This may reduce the accumulation of debris in places in the lithographic apparatus where it is difficult to mitigate. It may result in a higher collector lifetime and/or less transmission loss in the lithographic apparatus due to the presence of debris mitigation systems.

Although embodiments of the invention have been described in relation to Sn fuel droplets, the invention may be applied to droplets of other fuels.

The term extreme ultraviolet (EUV) radiation as used above may be interpreted as meaning electromagnetic radiation having a wavelength of less than 20 nm, for example within the range of 10-20 nm, for example within the range of 13-14, for example within the range of 5-10 nm, for example such as 6.7 nm or 6.8 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A radiation source configured to generate extreme ultraviolet radiation, the radiation source comprising:
 a droplet generator constructed and arranged to generate fuel droplets;
 a thermal heater surrounding part of a path along which the fuel droplets travel from the droplet generator, the thermal heater constructed and arranged to thermally heat the fuel droplets after the fuel droplets have exited the droplet generator, and reduce the mass of fuel present in the fuel droplets and/or reduce the density of the fuel droplets; and
 a radiation emitter constructed and arranged to direct radiation onto the fuel droplets that have been heated by the thermal heater to generate the extreme ultraviolet radiation.

2. The radiation source of claim 1, wherein the thermal heater comprises one or more heater elements constructed and arranged to radiate heat onto the droplets.

3. The radiation source of claim 1, further comprising a mitigation system constructed and arranged to mitigate fuel vapor that is generated when the droplets are heated by the thermal heater.

4. The radiation source of claim 3, wherein the mitigation system comprises a cylinder that is constructed and arranged to substantially surround the droplets.

5. The radiation source of claim 3, wherein the mitigation system is configured to provide a gas flow that carries the fuel vapor to one or more exit ports.

6. The radiation source of claim 1, wherein the thermal heater is arranged to reduce the amount of fuel present in the fuel droplet by more than 10%.

7. The radiation source of claim 1, wherein the thermal heater is arranged to reduce the amount of fuel present in the fuel droplet by more than 40%.

8. A lithographic apparatus comprising:
 a radiation source configured to generate extreme ultraviolet radiation, the radiation source comprising a droplet generator constructed and arranged to generate fuel droplets, a thermal heater surrounding part of a path along which the fuel droplets travel from the droplet generator, the thermal heater constructed and arranged to thermally heat the fuel droplets after the fuel droplets have exited the droplet generator, and reduce the mass of fuel present in the fuel droplets and/or reduce the density of the fuel droplets, and a radiation emitter constructed and arranged to direct radiation onto the fuel droplets that have been heated by the thermal heater to generate the extreme ultraviolet radiation;

a support constructed and arranged to support a patterning device configured to pattern a radiation beam comprising the extreme ultraviolet radiation; and a projection system constructed and arranged to project the patterned radiation onto a substrate.

9. A method of generating extreme ultraviolet radiation, the method comprising:

generating droplets of fuel with a droplet generator;

thermally heating the fuel droplets using a thermal heater surrounding part of a path along which the fuel droplets travel after the fuel droplets have exited the droplet generator to reduce the mass of fuel present in the fuel droplets and/or reduce the density of the fuel droplets; and subsequently directing radiation onto the fuel droplets to generate the extreme ultraviolet radiation.

10. The method of claim 9, wherein the amount of fuel present in the fuel droplet is reduced by more than 10%.

11. The method of claim 9, wherein the amount of fuel present in the fuel droplet is reduced by more than 40%.

* * * * *